United States Patent [19]

Hallgren

[11] Patent Number: 4,683,458
[45] Date of Patent: Jul. 28, 1987

[54] CURRENT-STEERING DIGITAL-TO-ANALOG CONVERTER FOR PROVIDING BI-DIRECTIONAL CURRENTS THROUGH A LOAD

[76] Inventor: Robert Hallgren, 142 Cornell Quarters, Ithaca, N.Y. 14850

[21] Appl. No.: 891,129

[22] Filed: Jul. 31, 1986

[51] Int. Cl.$^4$ ............................................... H03M 1/80
[52] U.S. Cl. ............................... 340/347 DA; 381/111
[58] Field of Search ............... 340/347 DA; 381/111, 381/116, 117

[56] References Cited

U.S. PATENT DOCUMENTS 3,201,778  8/1965  Porter ........................... 340/347 DA
3,325,805  6/1967  Dorey ........................... 340/347 DA Primary Examiner—Charles D. Miller

[57] ABSTRACT

A digital-to-analog converter capable of bi-directional output currents which is especially useful for direct conversion of digitally encoded audio signals. The converter is made up of a plurality of bit-cell circuits, one per bit in the digital number to be decoded, each fed by a pair of current sources of identical magnitude and opposite direction. Each bit-cell is a bridge circuit of four controllable devices, controlled by a data bit and its complement so that the current flow through the current output of the cell reverses based upon the value of the data bit. The outputs of the bit-cells are paralleled, and the current source pairs are scaled in a binary fashion, so that each bit-cell steers a current which is one-half that of the next-higher cell.

In a preferred embodiment, the current sources are made up of two binary scaled current generators using R−2R resistor networks to scale currents from two reference sources. The two references are preferably linked to each other through a feedback circuit. One reference may be varied (the other tracking automatically) to act as a volume control.

11 Claims, 10 Drawing Figures $B_S$ = SIGN BIT

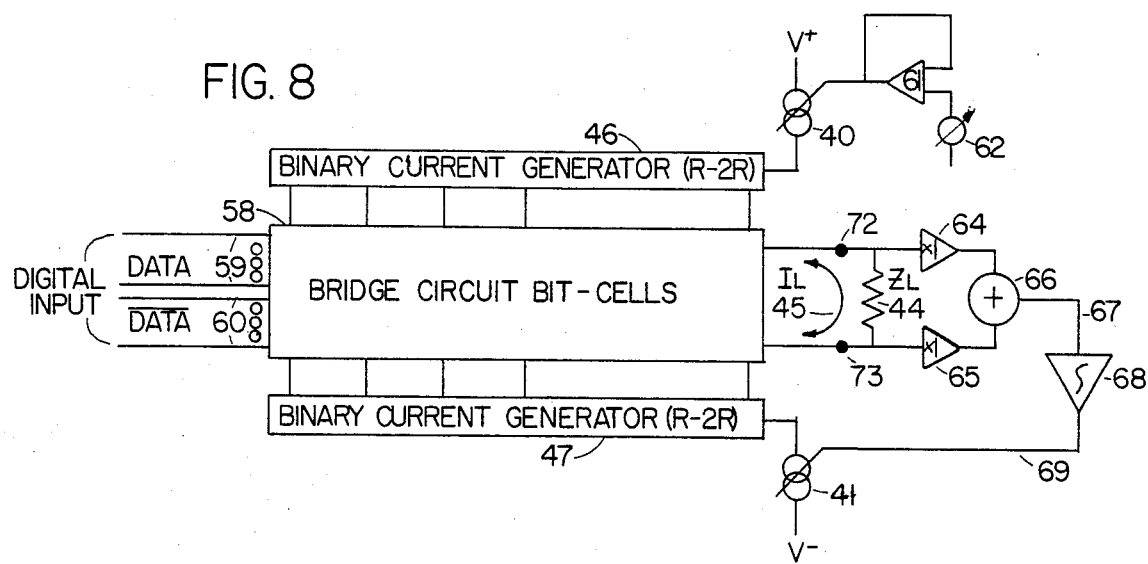
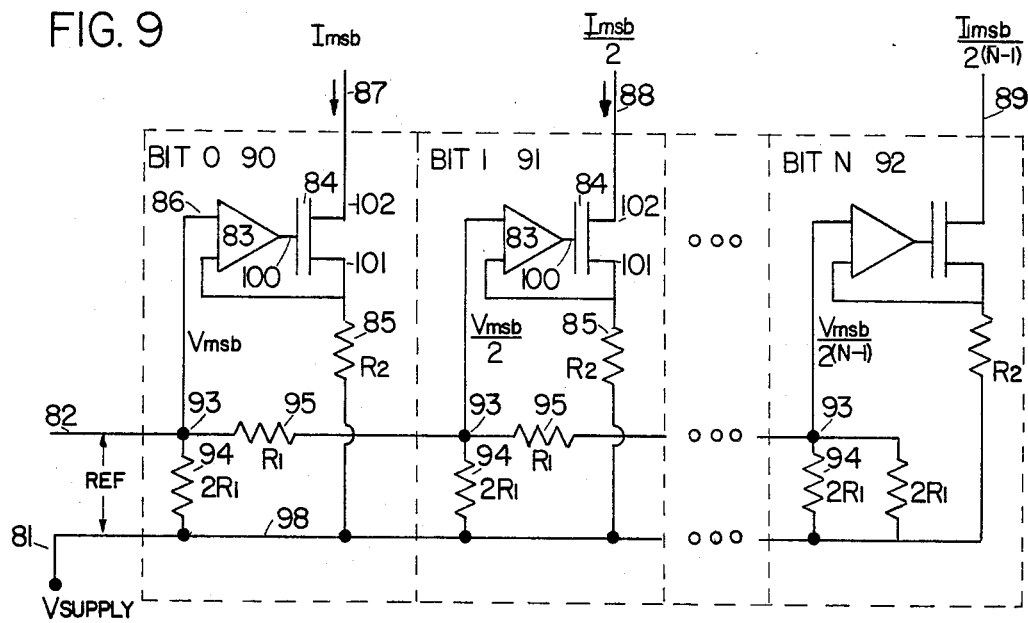

CURRENT-STEERING DIGITAL-TO-ANALOG CONVERTER FOR PROVIDING BI-DIRECTIONAL CURRENTS THROUGH A LOAD

BACKGROUND OF THE INVENTION

The invention pertains to the field of Digital-to-Analog (D/A) converters.

The direct conversion of multiple-bit digital signals to bidirectional analog currents has become especially useful only very recently. The Compact Disk (CD) audio recording system, which is gaining in popularity, uses a digital recording technique, rather than the analog technique used on conventional records and tapes. The audio signal representing the music is sampled 40,000 to 80,000 times per second. The signal voltage at that instant of time is expressed as a 16 bit digital number, and is recorded optically on the disk. This has major advantages, since the digital number is not subject to surface noise, hiss, distortion, or the other recording problems found in analog recording, because each digital number remains the same, even if there may be distortions in the recording of each bit.

CD players using the current technology read the disk using a laser, and then immediately reconvert the digital number to a small analog voltage using a conventional D/A converter. The analog voltage is then amplified conventionally in a conventional amplifier, and fed as an analog voltage to drive the loudspeaker. Unfortunately, this means that the advantages of digital recording are lost the instant the signal leaves the disk, as it were. Each of the succeeding analog amplification stages after the D/A converter introduces additional distortion and noise. On the other hand, the output signal from the D/A converter is too small to drive a loudspeaker. If one could directly use the digital signal from the disk to drive the loudspeaker, amplifying only the digital signal and converting to analog only in the positioning of the speaker cone, then the distortions and noise involved would be eliminated.

The ability to steer current bidirectionally and accurately based upon a digital source allows the signal to accurately position a loudspeaker cone. With unidirectional current, the cone can only be pulled in one direction, with a spring or cone suspension being responsible for returning the cone to a neutral position. Combining the bidirectional current steering with direct digital amplification leads to reproduction of the digitally encoded sound which is especially free from distortion and noise.

Existing D/A converters do not have the capacity to force bidirectional currents through a load. Most existing (see FIG. 1) D/A converters utilize binary weighted current sinks and active devices for switch pairs. These switch pairs direct the current sinks to one of two outputs. One terminal of the load is grounded and passes this current, which ranges from zero to the full scale supply current (Ifs).

If bidirectional current is needed (FIG. 2), an external current source is sometimes connected to supply a current of $\frac{1}{2}$Ifs, allowing currents of $-$Ifs to zero to $+$Ifs to be output by the D/A converter. By the standard formula $P = I^2 \times R$, the load power in such a case is $(\frac{1}{2}$Ifs$)^2$ times the load resistance (Rl), or one-quarter of the maximum power available (Po) (where Po$=$(Ifs)$^2\times$R). This is inefficient. Further, mismatches in the current source as opposed to the total sink current provided by the D/A converter introduces a source of inaccuracy.

Another approach to bidirectional current from a D/A converter is a bridge arrangement (FIG. 3), which uses an extra sign bit to direct the D/A converter output in alternate directions through a load. To change the output continuously from zero to $+$Ifs to zero to $-$Ifs (to form a sine wave, for example) one would need to key the D/A converter in an unusual code progression not usually found in digital systems, or, to put it another way, a standard binary progression from zero to the maximum would not result in a smooth progression in output. In the application of music reproduction from CD encoded sources, this is obviously of crucial importance.

U.S. Pat. No. 4,408,094, issued to Oura in 1983, shows an output circuit for digitally-encoded audio signals using a D/A converter driving a loudspeaker with a bi-directional signal. Oura's D/A converter, however, does not provide bi-directional output. Rather, Oura converts the digital signal to a uni-directional analog current signal in a D/A converter, then feeds the output to a bi-directional output stage. The output stage is a bridge circuit using 4 transistors driven by a voltage source (not matched current sources), in which the direction of the analog output current from the D/A converter is switched in accordance to a direction bit. The single voltage reference may be changed to act as a volume control.

Von Sichart, U.S. Pat. No. 4,415,883 [1983], shows the use of R$-$2R networks in D/A converters. The D/A converter provides unidirectional current, as do other D/A converter arrangements in Craven (U.S. Pat. No. 4,309,693 [1982]) and Smith (U.S. Pat. No. 4,383,248 [1983]).

Siligoni (U.S. Pat. No. 4,502,016 [Feb. 26, 1985]) shows a bridge circuit used as a final stage in an audio amplifier. The circuit is purely analog.

It is thus an object of the invention to provide a D/A converter which can be used to directly translate digital data into accurate analog current without requiring conversion of the digital code from standard coding.

It is a further object of the invention to provide a D/A converter which can efficiently produce accurate bidirectional current through a load in response to a multiple-bit digital input.

It is a further object of the invention to provide a D/A converter which can accurately and efficiently provide large enough bidirectional currents to drive a loudspeaker or similar load.

SUMMARY OF THE INVENTION

The invention provides bidirectional steering of current based upon multiple-bit digital signals, using multiple bridge circuit cells with matched current sources. The elements of the bridge circuits are preferably of complementary P- and N-channel Field Effect Transistors (FETs), but any device which would control a current based on an exernal input could be used. Each of the cells decodes a single bit of binary encoded data from the most significant bit (msb) to the least significant bit (lsb), using a pair of matched current sources to provide an output current from each cell which is a power of two more than the next lower cell. The outputs of the cells are connected in parallel, so that the entire D/A converter provides a total current which is an accurate representation of the binary input number. The total output current is nearly zero at equilibrium, and is a maximum of (plus and minus) approximately twice the current of the most significant bit (Imsb).

The matched current sources in the cells may be created using R−2R networks and two current sources. One of the current sources could then be regulated to allow precise matching and stabilization of the current sources.

BRIEF DESCRIPTION OF THE DRAWING

FIG. 8 shows a block diagram of an alternative preferred emodiment, having added regulation of the reference current FIG. 9 shows an alternative preferred embodiment of a binary weighted current generator specifically for generating large valued currents.

DESCRIPTION OF THE PREFERRED EMBODIMENT

The invention provides a D/A converter, in which a digital input signal is converted to a bi-directional current output.

Figure 1:
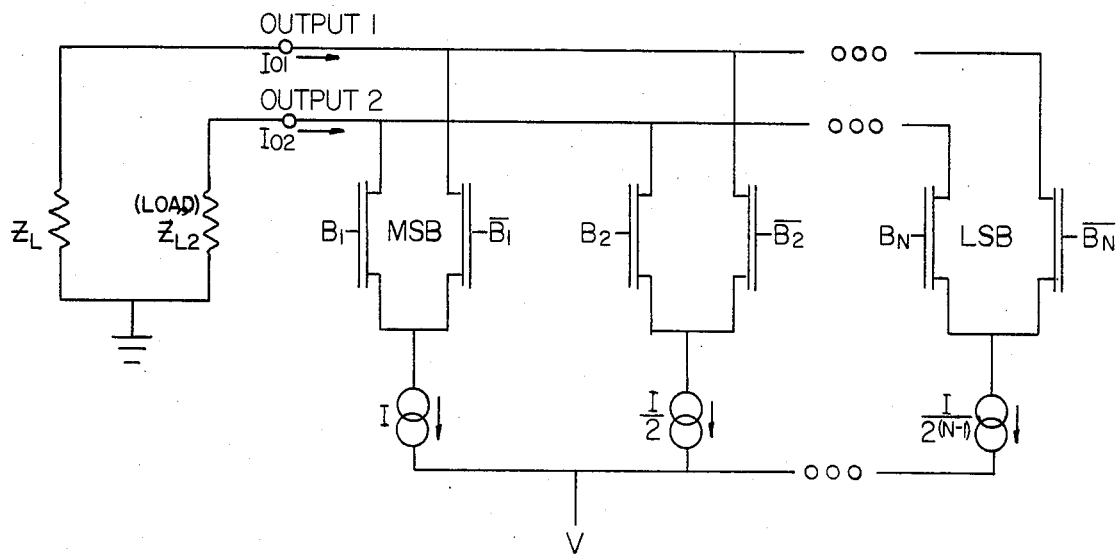
FIGS. 1, 2 and 3 show prior art D/A converter arrangements
Figure 2:
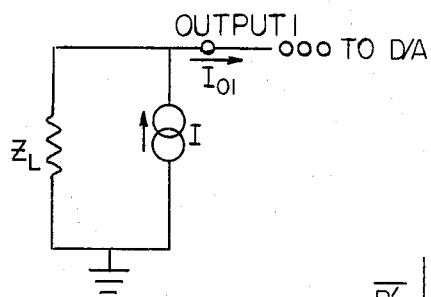
Figure 3:
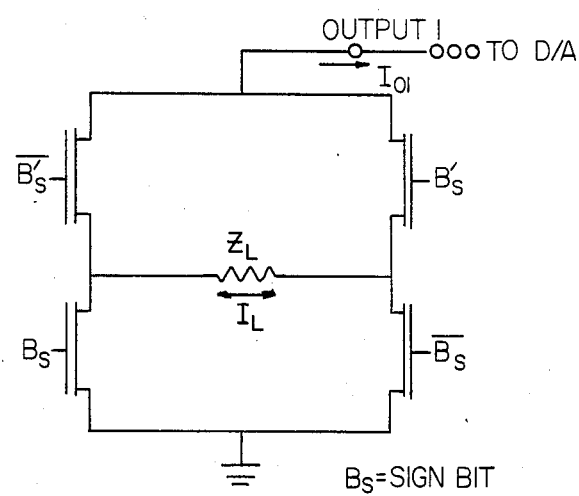
Figure 4A:
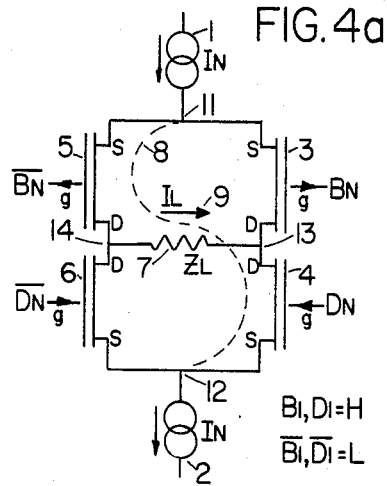
FIGS. 4a and 4b show a single cell of the invention, with current flows
Figure 4B:
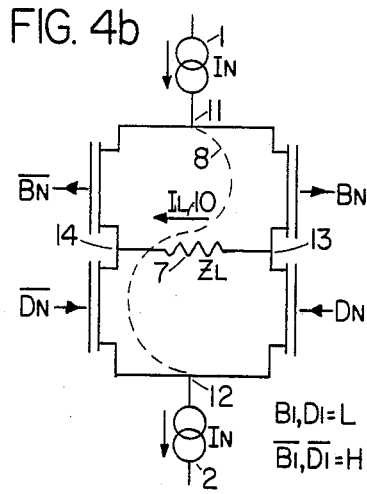

The conversion is done through a plurality of identical circuits, termed "bit-cells", with associated pairs of scaled current sources. FIGS. 4a and 4b illustrate a single bit-cell with its pair of current sources. Each bit-cell is a bridge circuit using four devices (3,4,5,6) which can control (switch) a current (8) flowing through the device from an input (s) to an output (d) based upon a control input (g). The output current (I1) (9) for the load (Z1) (7) flows between the two center points of the bridge in a direction determined by the values of the bit inputs (B, $\overline{B}$).

Throughout this explanation of the preferred embodiment of the invention, the controllable devices are shown and described as complementary Field Effect Transistors (FET's). These devices are preferred because of their speed and electrical characteristics, and ease of fabrication of an array of bit-cells into a single integrated circuit. However, it will be understood by one skilled in the art that any controllable device which can switch currents based on a control input could be used. Such devices could be optoisolators, ordinary junction transistors, or even electromechanical relays in a very low speed embodiment.

The bit-cell in the preferred embodiment illustrated in FIGS. 4 comprises four field effect transistors, (3,4,5,6). The top pair (3,5) is of complementary type to the bottom (4,6). That is, (3,5) are P-channel, (4,6) are N-channel. This is done to allow the transistors to switch the currents in the proper fashion, as described herein. It will be understood by one skilled in the art that there are other ways of accomplishing the same result, and the method will vary based upon the type of device chosen to make up the bridge circuit.

The inputs to the cell are Bn and its complement $\overline{Bn}$, which are the control inputs (g) of the devices of the bridge. In the example FIGS. 4, two of the control inputs are shown as Dn and $\overline{Dn}$: these are logically identical (Low or High) to Bn and $\overline{Bn}$, but may vary in actual value depending on the physical characteristics of the devices used in the bridge. That is, an N-channel FET might require a different voltage to turn on than a P-channel. Other devices which were used in complementary arrangement might require other values for the actual voltage/current at B and D. Some devices (say optoisolators) might be able to use exactly the same inputs, so that Bn=Dn and $\overline{Bn}=\overline{Dn}$ in value as well as logically. This would be obvious to one skilled in the art, and will not be referred to again herein. For the purpose of understanding the cell, it can be assumed that B and D are the same, and they are accordingly shown as a single bit input on the block diagram. The logical value applied to the control inputs of each pair of devices on either side of the bridge (3,4) and (5,6) is the same—that is, Bn (and Dn) to devices (3) and (4), $\overline{Bn}$ (and $\overline{Dn}$) to devices (5) and (6).

The complementary inputs may be supplied by the same devices which drive the D/A converter (many standard TTL integrated circuits have complementary outputs as a matter of course), or can easily be derived from the data bit signals using standard inverters in a method well known to the art.

The devices of the two vertical opposite pairs of devices in the bridge must be arranged such that both devices in each vertical pair (3,5) and (4,6) (that is, the pair attached to the same current input (11) or (12), "above" or "below" the load) are activated by the same logical value of input signal: either high (logical "1" or "on") or low (logical "0" or "off"). At the same time, the devices of each vertical pair (3,4) and (5,6) (that is, pair of devices attached to the same load terminal (13) or (14)) must be activated by complementary logical values. That is, devices (3) and (5) are "on" for logical "low", (4) and (6) are "on" for logical "high".

The dotted line for the current flowing through the cell (8) in FIGS. 4a and 4b shows the effect of this arrangement as the logical value of the data bit is changed from high (binary "1") to low (binary "0"). When the data bit B is high (FIG. 4a), the control inputs ((3g) and (4g)) of devices (3) and (4) are high. The complementary signal $\overline{B}$ is obviously low, and thus so are the control inputs ((5g) and (6g)) of devices (5) and (6). For the purposes of this example, we can assume that a logical value of "high" (of whatever actual value) activates N-channel devices (4) and (6), and that a logical value of "low" (of whatever actual value) activates P-channel devices (3) and (5). Thus, devices (4) and (5) are activated when the BIT value is high. The current I1 flows from the first current input (11) through the input (5s) and output (5d) of device (5), to load terminal (14). Device (6) is inactive, thus the entire current (8) flows from terminal (14) to terminal (13) through the load Z1 (7) from left to right. We may term this a "positive" load current I1 (9). Device (4) is activated, so the current flows from its input (4d) to its output (4s) and to the second current input (12).

In FIG. 4b, we invert the bit input, so that B is now low and $\overline{B}$ high. Devices (3) and (6) are now active and (4) and (5) inactive. The current (8) now flows from the first current input (11) through the input (3s) and output (3d) of device (3) to load terminal (13). Since device (4) is inactive, the current (8) flows from terminal (13) to terminal (14) through the load Z1 (7) from right to left. We may term this a "negative" load current I1 (10). Device (6) is activated, so the current flows from its input (6d) to its output (6s) and to the second current input (12).

Thus, it can be seen that the direction of current flow (I1) through the load (Z1) reverses direction based upon the bit signal value. We may say that the load current I1 is "steered" through the load by the bit signal.

The bit-cell current inputs are supplied with current by current sources (1) and (2). The two current sources must be matched exactly in magnitude, and opposite in sign (direction of flow). The current through the load (I1) is thus equal to that of the current sources (In), assuming no losses.

Figure 5:
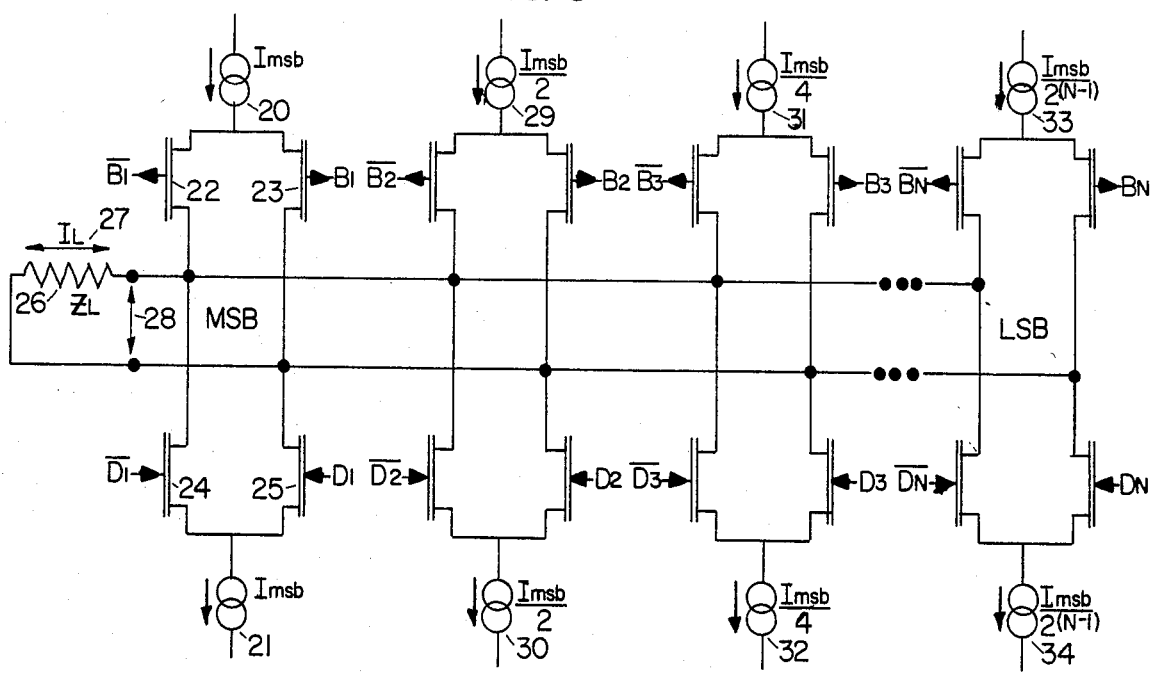
FIG. 5 shows a schematic of several cells of the invention in parallel arrangement

The bit-cell as described above is a simple arrangement for obtaining precise currents of value In with direction based upon a bit signal Bn. The invention is then assembled from a plurality of these bit-cells, with their associated current sources, arranged with all of the load terminals (13) and (14) connected in parallel (that is, all of the terminals (13) are connected together and all of the terminals (14) are connected together). One bit-cell, with its two current sources, is provided for each bit of the digital signal to be decoded. FIG. 5 shows such an arrangement, for a D/A converter of "n" bits. The load Z1 (26) is connected across the paralleled outputs (28). The highest order ($2^n$), or "most significant" bit is labeled "MSB", the lowest order ($2^0$ or 1) bit is labeled "LSB". The collection of bit-cells becomes a precision D/A converter by scaling the current sources from a maximum current (Imsb) (20,21) to a minimum (I1sb) (33,34) for each bit of the number. Each current source of each pair (20,21), (29,30), etc., is identical in magnitude to the other source of the pair, and one-half the magnitude of the current sources of the next more significant bit (except, of course, the most significant bit sources (20) and (21) which are equal to Imsb, since there is no more significant bit, by definition). If the "n" bit-cells are numbered from 0 to (n−1), then the magnitude of a current source (Ibc) may be found by the formula: Ibc=Imsb/2 (where bc=the number of the cell, 0−>(n−1)).

By adding all of the currents from all of the bit cells, the load current I1 (27) may be seen to be a bi-directional current varying from approximately −(2Imsb) at a data value of "0000 . . . 0" to approximately 2Imsb at a data value of "1111 . . . 1". Actually, the maximum currents are twice the most significant bit current (Imsb) less one-half the least significant bit current (I1sb). For a 16 bit number, such as is used in encoding the audio on a digital audio system, I1sb is so much smaller than Imsb (I1sb=0.0000305×Imsb) that, for all intents and purposes the maximum current is twice Imsb (Imax"1.9999847×Imsb). The current at the center point, or a binary input of "1000...0" (or "0111...1"), is ±½I1sb (or ±Imsb×0.00001525).

The invention can be seen to require precisely matched current sources at each bit, and precisely weighted current sources between bits, to operate as a precision D/A converter. It is very difficult to match 32 sources (two each for 16 bits) as precisely as required, although this design is possible within the teachings of the invention.

Figure 6:
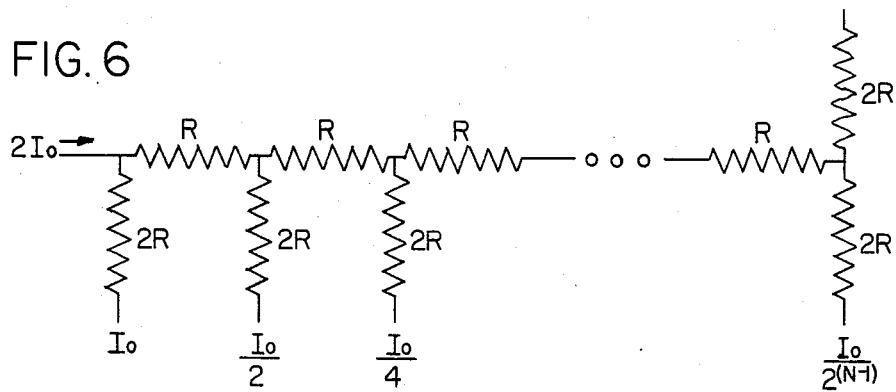
FIG. 6 shows an R−2R network

The preferred embodiment of the invention instead only uses two current sources. The total current from each source is divided using the well-known R−2R ladder network, shown in FIG. 6. The reference current, equal to the maximum current to be supplied (nearly 2×Imsb), is input to the ladder. Each output from the ladder is one-half of the preceding output, as required by the invention. Thus, only the total current from two current sources must be matched instead of 32 individual currents. The networks must be of sufficient precision that each current is accurate to or better.

Figure 7:
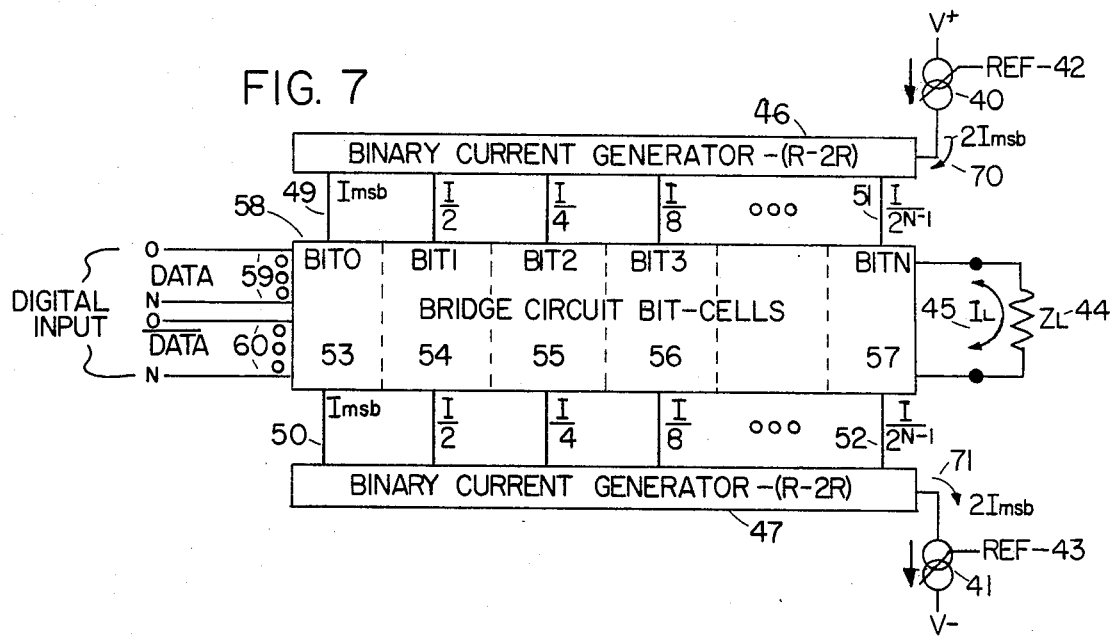
FIG. 7 shows a block diagram of the D/A converter of the preferred embodiment

FIG. 7 shows a block diagram of the preferred embodiment of the invention constructed using two current sources (40) and (41). The current sources are adjusted to the correct current by references (42) and (43), respectively. Block (58) represents "n" bit-cell circuits (53)–(57), as detailed above. The outputs of the bit-cells are paralleled as shown in FIG. 5, and produce a bi-directional I1 (45) to feed the load Z1 (44). Current source (40) feeds a current of 2Imsb (actually 2Imsb−½I1sb, as noted above) to an R−2R ladder binary current generator, which has "n" outputs (49), one for each bit-cell. Similarly, current source (41) feeds its current (71) to R−2R binary current generator (47), which feeds the bit-cells through outputs (50). The digital signal input is shown as data lines, DATA bits 0−(n−1) (59) and its complement DATA bits 0−(n−1) (60). The input lines are each led to their respective bit-cells, as discussed above and shown in FIG. 5.

The D/A converter of FIG. 7, although preferred over one with 2n separate current sources, is still limited by the accuracy of the match of the two current sources, especially under dynamic conditions. FIG. 8 shows an alternative preferred embodiment which addresses this problem.

In FIG. 8, the blocks numbered the same as in FIG. 7 are the same. That is, the bit-cells (58), R−2R ladder current generators (46) and (47), digital inputs (59) and (60) and load output (45) are the same. The current sources (40) and (41) may also be the same.

The improvement in FIG. 8 lies in adjusting one of the current sources (41) in response to load conditions, so as to track that current source with the other (40). This is done by sensing the voltage at each load terminal (72) and (73) of the load Z1 (44), and forcing a "virtual ground" at the center of load. That is, the sum of the voltages are forced to zero by adjusting the reference (69) at the second current source (41). The voltage at (72) is buffered in a conventional buffer amplifier at (64), and the the voltage at (73) is buffered at (65). The output of the buffers is summed in summation circuit (66), of conventional design, and the resultant signal is integrated in a conventional integrator circuit (68). The integrator (68) will integrate any non-zero votage from the summer, indicating an error condition. The voltage output (69) from the integrator (68) increases in the proper polarity, adjusting the current source (41) until a match is achieved. Since the integrator output will stop changing when the error voltage becomes zero, the necessary voltage to maintain the match is then held by the integrator. The control circuit is thus an analog, real-time, first-order control system, and as such it continuously adjusts the current source (41) to match the other current source (40), irrespective of temperature changes, load currents, or other sources of error. In this way, a constant ideal match can be achieved and maintained that compensates for errors, and the system is held within a stable operating range.

Another feature of the preferred embodiment is shown in FIG. 8. Since the two current sources will track exactly, due to the feedback circuit described above, the first current source can be adjusted to any value of Imsb desired, and the second source will automatically follow. This allows the first current source output to be varied to vary the magnitude of the output current, while still maintaining an absolutely acurate D/A conversion. Varying the magnitude of the output current varies the amount of power in the load, hence the first current source variation can act as a volume control for a loudspeaker system. In FIG. 8, the reference for current source (40) is shown as a conventional follower circuit (61). The follower has a variable input used as a volume control (62). As the variable input is changed, the output of the follower is applied to the current source (40) to regulate its output. Thus, variable input (62) acts as a volume control by increasing or decreasing source (40), which is then tracked automatically by source (41).

In high power, high current circuits (such as might be required for higher power loudspeaker-driver applications) the use of a pure R−2R ladder for the binary current generator blocks (46,47) might not be practical. Commercial R−2R networks are made from relatively high resistance values (hence high losses at high currents), and they are also not available in high wattage versions. At relatively high power levels, there would be a fairly high level of power dissipation in the resistors of the network, hence a problem with heat and its effects. FIG. 9 shows an alternative embodiment for the binary current generators (FIGS. 7,8 (46,47)), which uses available R−2R networks for the tracking and accuracy aspects, just as in the earlier examples, but which uses precision power resistors and transistor regulators to generate the large currents. FIG. 9 shows the arrangement for current generator (47) in FIGS. 7 and 8. The changes necessary to adapt the circuit to provide the currents of generator (46) will be obvious to one skilled in the art.

In FIG. 9, it will be seen that the binary current generator (80) comprises a plurality of identical blocks (90,91,92), one for each bit 0−>(n−1), to supply the "n" binary currents required (87,88,89). Resistors (94), of value 2R1, and resistors (95), of value R1, are connected as an R−2R network, just as in the earlier-described embodiments. The reference input (82) and supply line (81) feed the R−2R network. The voltage at each R−2R junction (93) is fed as an input into operational amplifiers (83), connected as unity-gain amplifiers in a method well-known to the art. The output of the amplifier (100) controls the gate of a transistor (84). The source (101) of the transistor (84) is connected to ground through series resistor (85), which is a precision high-power type capable of dissipating the power required. All of the resistors (85) are identical. The drain (102) of the transistor (84) is the current output (87–89) for the block (90–92). Since all of the cells are identical, and the voltage at junctions (93) is scaled in a binary fashion by the R−2R network, the currents are similarly scaled in binary fashion. The R−2R ladder need not be capable of high power, since the amplifiers (83) draw effectively no current from the network, and commercially available precision networks can be used. The resistors (85) must be precision resistors, but there is little problem obtaining matched precision individual resistors of the power ratings needed.

Accordingly, it is to be understood that the embodiments of the invention herein described are merely illustrative of the application of the principles of the invention. Reference herein to details of the illustrated embodiments are not intended to limit the scope of the claims which themselves recite those features regarded as essential to the invention.

I claim:

1. A digital-to-analog converter for converting a digital input signal comprising a binary encoded number having a plurality of data bits, the signal appearing at a digital signal input and its complement appearing at a complementary signal input, to a bidirectional analog current output representation of the digital input signal, the analog current output being adapted to supply current to a floating load at a first and second current output means, the digital-to-analog converter comprising:

(a) a plurality of bit-cell circuits, one for each data bit in the digital input signal, each bit-cell circuit comprising:
  (1) a first current input;
  (2) a second current input;
  (3) a data bit input and a complementary data-bit input, the complementary data-bit input being the logical inverse of the data-bit input;
  (4) first and second current output means for supplying current to a load;
  (5) a bridge circuit comprising four controllable devices arranged in two pairs, each device having an input, an output, and control input means for activating the current flowing from the input to the output in response to a predetermined logical value at the control input;
  (7) the inputs of the first pair of controllable devices being connected to the first current input;
  (8) the outputs of the second pair of controllable devices being connected to the second current input;
  (9) the output of one of the first pair of controllable devices and the input of one of the second pair of controllable devices being connected to each other and to the first current output means;
  (10) the output of the other of the first pair of controllable devices and the input of the other of the second pair of controllable devices being connected to each other and to the second current output means;
  (11) the control inputs of the two controllable devices whose input or output is connected to the first current output means being connected to the data-bit input;
  (12) the control inputs of the other two controllable devices being connected to the complementary data-bit input;
  (13) the controllable devices being chosen such that the logical value at the control input which activates the current flow in the two controllable devices whose inputs are connected to the first current input is the complement of the logical value which activates current flow in the two controllable devices whose outputs are connected to the second current input;

(b) a plurality of current source means for providing a regulated current of a given magnitude, arranged in pairs, one pair of current source means being associated with each bit-cell circuit, each pair of current source means comprising two current source means for supplying a plurality of currents of identical magnitude and opposite direction, one current source means of each pair being connected to the first current input of the bit-cell circuit with which the pair is associated, and the other current source means of the pair being connected to the second current input of the bit-cell circuit;

(c) the magnitude of the current provided by each pair of current source means except those associated with the bit-cell circuit for the most significant bit in the digital input signal, being chosen to be one-half that of that provided by the pair of current source associated with the bit-cell for the next most significant bit;

(d) the data bits of the input digital signal being connected to the data bit inputs of the bit-cell circuits, and the complementary signals of the data bits being connected to the complementary data bit inputs of the bit-cell circuits;

(e) the first current output means of each of the bit-cell circuits being connected together in parallel, and the combination being then connected to the first current load output means of the digital-to-analog converter;

(f) the second current output means of each of the bit-cell circuits being connected together in parallel, and the combination being then connected to the second current load output means of the digital-to-analog converter.

2. The digital-to-analog converter of claim 1, in which the pairs of current sources comprise:

(a) a first current source having a reference input means for controlling output current and a regulated current output controlled by the reference input means;

(b) a second current source having a reference input means for controlling output current and a regulated current output controlled by the reference input means;

(c) a first voltage reference having an output connected to the reference input means of the first current source;

(d) a second voltage reference having an output connected to the reference input means of the second current source;

(e) a first network means for dividing the first current source into multiple currents, comprising an R—2R network of resistors, a current input and a plurality of current outputs, whereby each current output is one-half of the next higher current output;

(f) a second network means for dividing the second current source into multiple currents, comprising an R—2R network of resistors, a current input and a plurality of current outputs, whereby each current output is one-half of the next higher current output;

(g) the current outputs of the first network means forming the current sources connected to the first current input means of each bit-cell circuit;

(h) the current outputs of the second network means forming the current sources connected to the second current input means of each bit-cell circuit;

(i) the value of the first and second voltage references being chosen to be substantially identical, and to result in the desired current at the most significant bit.

3. The digital-to-analog converter of claim 2, in which the second voltage reference is adapted to be varied in response to variations in the first voltage source, whereby the two current sources of each pair are held to be as nearly identical as possible.

4. The digital-to-analog converter of claim 3, further comprising:

(a) comparator means for detecting voltage difference having first and second voltage inputs connected to the first and second current load outputs of the digital-to-analog converter, and an output proportional to the voltage difference between the two outputs;

(b) the second voltage reference having an input for varying the value of the reference voltage output connected to the output of the comparator means;

(c) the second voltage reference being adapted to vary its voltage in response to the value of the input, whereby the second current source is varied in such a way that the voltage difference detected by the comparator means is as close to zero as possible.

5. The digital-to-analog converter of claim 3 in which the first voltage reference further comprises an input for varying the value of the reference voltage output, and control means for varying the input, whereby the voltage reference may act as a volume control.

6. The digital-to-analog converter of claim 1 in which the controllable devices of the bridge circuit are complementary field-effect transistors.

7. The digital-to-analog converter of claim 1 in which the digital signal being decoded represents digitally encoded audio.

8. The digital-to-analog converter of claim 7 in which the load is a loudspeaker.

9. The digital-to-analog converter of claim 1 adapted for higher currents, in which the pairs of current sources comprise two binary current generator means for generating a plurality of binarily scaled currents, each binary current generator comprising:

(a) voltage reference means for providing a regulated voltage output;

(b) network means for dividing the voltage reference means into multiple voltages, comprising an R—2R network of resistors having a voltage input connected to the regulated voltage output of the reference means, and a plurality of voltage outputs, whereby each voltage output is one-half of the next higher voltage output;

(c) a plurality of current regulator means, one for each current output, each current regulator means comprising: current control means for controlling flow of current, having a control input connected to one of the voltage outputs of the network means, an output for supplying regulated current, and an input connected to a source of voltage through a resistor, whereby the voltage applied to the control input determines the magnitude of the output current;

(d) the resistors of all of the current regulator means being of identical value, whereby the scaled voltage outputs of the network means results in scaled output currents;

(e) the current outputs of the current regulator means forming the current sources connected to a current input means of each bit-cell circuit;

(f) the value of the voltage reference being chosen to result in the desired current at the most significant bit.

10. The digital-to-analog converter of claim 9 in which the digital signal being decoded represents digitally encoded audio.

11. The digital-to-analog converter of claim 10 in which the load is a loudspeaker.

* * * * *